United States Patent
Buzzi et al.

(10) Patent No.: US 7,683,293 B2
(45) Date of Patent: Mar. 23, 2010

(54) TRANSPARENT HIGH TEMPERATURE RESISTANT AND PROTECTIVE COATING FOR DOMESTIC APPLIANCES AND METHOD FOR ITS DEPOSITION

(75) Inventors: Ermanno Buzzi, Varese (IT); John Doyle, Buguggiate (IT); Thomas Friesen, Roncello (IT)

(73) Assignee: Whirlpool Corporation, Benton Harbor, MI (US)

(*) Notice: Subject to any disclaimer, the term of this patent is extended or adjusted under 35 U.S.C. 154(b) by 1268 days.

(21) Appl. No.: 11/090,429

(22) Filed: Mar. 25, 2005

(65) Prior Publication Data

US 2005/0269310 A1 Dec. 8, 2005

(30) Foreign Application Priority Data

Mar. 25, 2004 (EP) .................................. 04101245

(51) Int. Cl.
*H05B 3/68* (2006.01)
*C23C 16/00* (2006.01)

(52) U.S. Cl. .............................. 219/452.11; 219/443.1; 219/444.1; 219/460.1; 219/461.1; 219/465.1; 204/192.16; 204/192.26; 427/255.7; 427/419.2; 427/419.7; 501/11; 501/12; 501/83; 501/133; 524/506; 524/268; 524/449; 524/499

(58) Field of Classification Search .............. 219/443.1, 219/444.1, 452.11, 452.1, 460.1, 461.1, 465.1, 219/467.1; 204/192.16, 192.26; 427/255.7, 427/419.2, 419.7, 529; 501/11–12, 84, 133; 524/506, 268, 449, 499, 934

See application file for complete search history.

(56) References Cited

U.S. PATENT DOCUMENTS

| 2,606,510 | A | * | 8/1952 | Collings ...................... 426/505 |
| 5,192,410 | A | * | 3/1993 | Ito et al. ................. 204/192.16 |
| 5,554,681 | A | * | 9/1996 | Patel .......................... 524/506 |
| 6,077,567 | A | | 6/2000 | Boerio et al. |
| 2005/0208272 | A1 | * | 9/2005 | Groll .......................... 428/172 |

FOREIGN PATENT DOCUMENTS

| JP | 61110769 | | 5/1986 |
| JP | 62087114 | | 4/1987 |
| JP | 2001-252184 | * | 9/2001 |
| JP | 2001252184 | | 9/2001 |

* cited by examiner

*Primary Examiner*—Shawntina Fuqua
(74) *Attorney, Agent, or Firm*—John W. Morrison; Diederiks & Whitelaw PLC

(57) ABSTRACT

A domestic appliance, particularly a cooking appliance, having a metallic surface, is provided with a coating based on silicon oxide. Such coating is deposited on the metallic surface by plasma enhanced chemical vapor deposition (PECVD). The coating protects the metallic surface from scratching, staining and thermal yellowing.

3 Claims, 2 Drawing Sheets

TRANSPARENT HIGH TEMPERATURE RESISTANT AND PROTECTIVE COATING FOR DOMESTIC APPLIANCES AND METHOD FOR ITS DEPOSITION

BACKGROUND OF THE INVENTION

1. Field of the Invention

The present invention relates to a domestic appliance, particularly a cooking appliance, having an exposed metallic surface, for instance a stainless steel, chromed steel, nickel-chromed steel, or aluminum surface, that can be subject to mechanical (scratching), chemical (staining), and thermal (yellowing) deterioration, and that can benefit from added protection against the consequent aging during ordinary use.

2. Description of the Related Art

It is generally recognized that metallic parts used in the domestic appliance field (e.g., stainless steel, chromed-steel, nickel-chromed steel, and aluminum components such as cooktop tables, gas burners and caps, grids, oven grates, oven frontal panels, barbecue grids, etc.) are exposed to a high-temperature environment. This high-temperature can induce accelerated oxidation over some metallic surfaces. Stainless steel, for example, is thereby subject to aesthetically unpleasing yellowing. In certain cases (i.e. in gas cooking appliances) the environment is further enabling oxidation due to the presence of flames near the metal surfaces. Moreover, these parts are subject to chemical corrosion and stainability caused by contact with food-stuff and cleaning agents, and the time-consuming and abrasive efforts required to clean such surfaces (e.g., a stainless steel surface) can cause surface scratches, which then provide a rough substrate onto which charred food-spills can further attack. Furthermore, the removal of exogenous material, such as evaporated water scale residues, normally requires chemical agents creating growing environmental concerns. Moreover fingerprint marks, as well as halos and residues of detergents are very visible and not easy to remove on stainless steel components. Furthermore, aluminum components cannot be safely dish-washed without blackening their surface, because alkaline detergents present in the dishwasher soap cause chemical attack to aluminum.

Sol-gel based methods of depositing inorganic protective films have been applied in the industry, but the curing temperatures and times required to obtain sufficiently dense coatings, enabling good oxygen-barrier properties, cause yellowing of the stainless steel substrate. Moreover, the maximum coating thickness achieved by such known processes is of one or two microns, unless a multi step coating process is applied. This low thickness can reduce the oxygen barrier performance, compared to thicker (e.g., 5 microns) but equally or more dense coatings made of the same material.

U.S. Pat. No. 5,192,410 discloses a method for coloring a stainless steel parts of buildings and automobiles in which a colored and transparent double coating is envisaged. Such patent is not concerned with resistance at high temperatures (typical for cooking appliances), rather with rust resistance only (weather), i.e. corrosion at ambient temperature.

JP 62 087114 is concerned with coating cooking utensils (i.e. frying pans, hot plates etc.) with $SiO_2$ in order to increase the cooking efficiency of food.

JP 61 110769 relates to the coating of knife blade edges with Si oxides to avoid contamination of the cut food by metallic salts and ions otherwise leached out from the steel blade.

Accordingly, it would be advantageous to provide metallic parts used in the domestic appliance field with improved protection against high-temperature oxidation, corrosion, abrasion, and maintenance wear-and-tear. A secondary objective is to provide stainless steel parts used over domestic appliances, particularly cooking appliances, with a lower visibility of stains/fingerprints and an easier, less time consuming, and more environmental friendly removal of detergent residual halos, water-induced scale, and fingerprints when compared to bare stainless steel surfaces. A further objective is to enable dishwashing possibility (i.e., alkaline corrosion resistance) for aluminum components.

SUMMARY OF THE INVENTION

According to the invention, the applicants have found that by providing the metal surface of a domestic appliance, particularly a cooking appliance or a component thereof, with a coating film based on silicon oxide, particularly deposited on the metal surface by plasma enhanced chemical vapor deposition (PECVD), a very good result is obtained in term of protection from high-temperature oxidation and consequential stainless steel yellowing and to chemical stainability, improved surface scratch resistance, and reduced visibility of stains/soil while improving the removal of water scale stains and fingerprint marks. With the term "based on silicon oxide" we mean every kind of layer whose composition is mainly silicon oxide, preferably with a chemical composition close to SiOx, where x can vary in a predetermined range.

The invention further provides a method of forming a protective and transparent multi-layer coating deposited by ion plating techniques using a multi-phase deposition process on stainless steel, steel, aluminum, iron, or other metal surfaces used in domestic appliances. The resulting coating ensures a high-temperature-resistant and excellent oxygen-diffusion barrier, thereby inhibiting high-temperature surface oxidation and consequent discoloration/yellowing of metallic substrates exposed to heat produced by heaters equipping domestic appliances. The coated surface further provides better corrosion-resistance, abrasion-resistance, ease-of-maintenance, lower visibility of domestic-soap induced halos, reduced fingerprint visibility, and easier removal of fingerprints, halos, and water scale residues compared to bare stainless steel surfaces. Moreover, coated aluminum components can safely be placed in a dishwasher without incurring in oxidation.

This invention is particularly useful for coating metals parts used in high-temperature cooktops and ovens (parts not contacting the food) as plates, burners, caps, bowls, grids, racks, gas cooktop and/or range metal top, range burner body, range burner cap, range burner grate, electric-coil cooktop and/or range metal bowls, warming drawer, microwave oven door external panels (control-panel, door-frame, backsplash panel), oven and/or range inside racks, oven and/or range inside radiation reflectors, microwave oven inside cavity walls, domestic kitchen hood external panel, domestic hood metallic smoke-filters, oven external panels and inside grates and other parts that can take advantage of such coating composition. The method and the composition further provide good adhesion of the coating to the substrate. The metal of the substrate can be stainless steel, aluminum, chromed steel, nickel-chromed steel, brass, magnesium, and titanium.

This invention also provides a deposition process to coat a surface with a transparent glass-like coating incorporating the deposition of at least one SiOx layer and possibly one intermediate SiC layer.

Owing to the coating composition and to the deposition method this coating, while exhibiting the above characteristics, is also transparent, aesthetically free from defects, hard, well adhered, flexible, and resistant to humidity, to UV light, to grease, to water vapor, to impact, and to temperatures up to 600° C.

BRIEF DESCRIPTION OF THE DRAWINGS

The features and advantages of the present invention will be more fully appreciated and the invention itself will be better understood when the following detailed description is read in conjunction with the accompanying drawings, in which.

DETAILED DESCRIPTION

Figure 1:
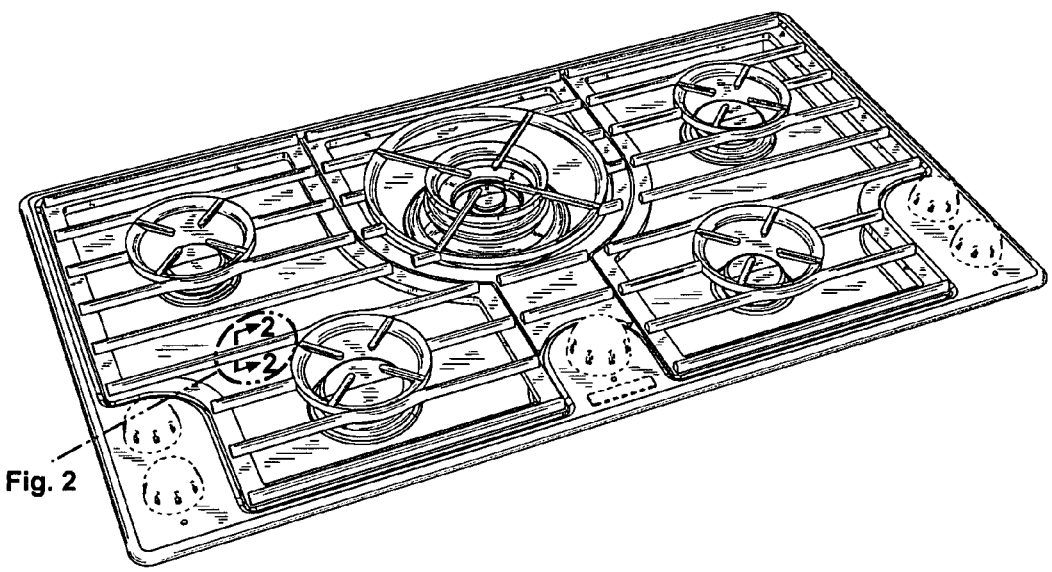
FIG. 1 is a schematic view of a cooktop according to the invention.
Figure 2:
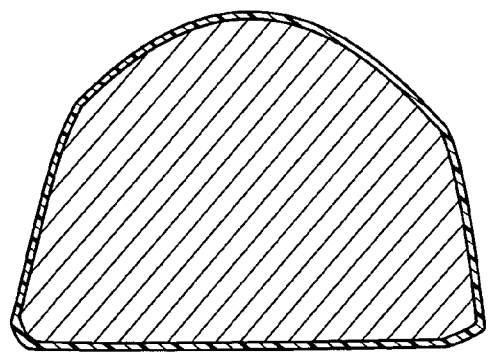
FIG. 2 is a cross-sectional view of the surface of the crossbars of the grate along line 2-2 of FIG. 1.
Figure 3:
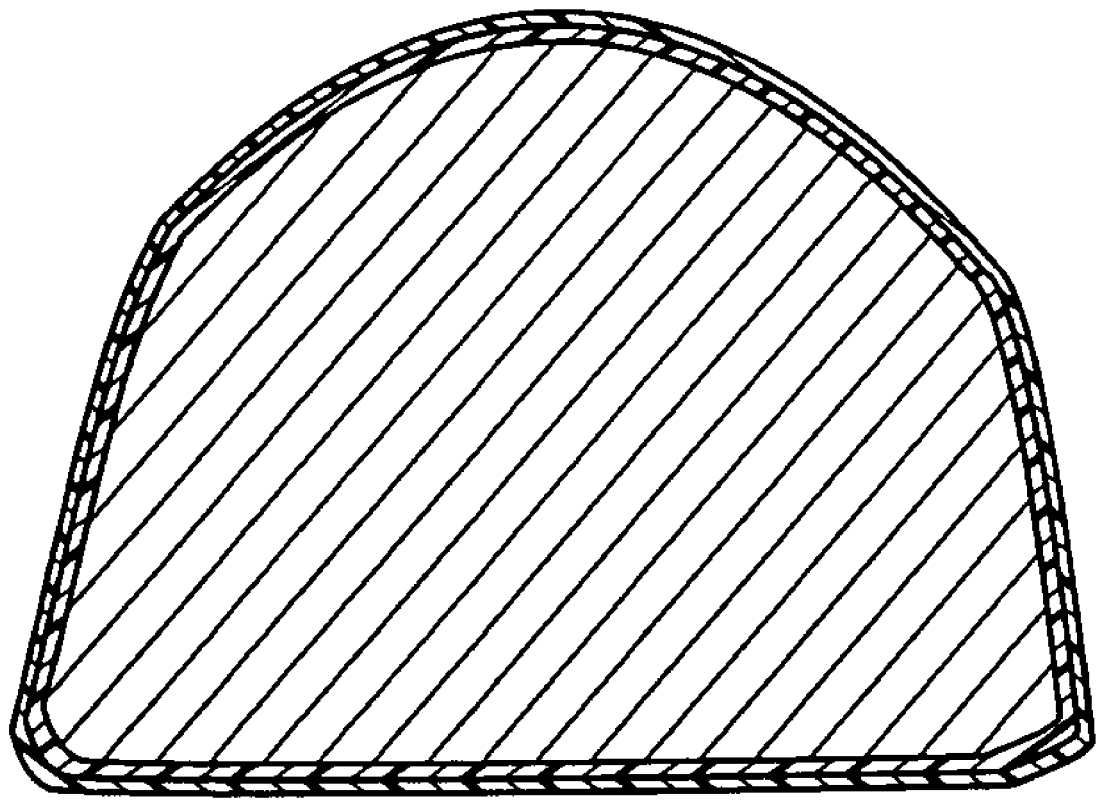
FIG. 3 is a cross-sectional view of the surface of the crossbars of the grate along line 2-2 of FIG. 1.

The invention embodies an appliance, particularly a cooking appliance, having a metallic surface, is provided with a coating based on silicon oxide. Such coating is deposited on the metallic surface by plasma enhanced chemical vapor deposition (PECVD). The coating protects the metallic surface from scratching, staining and thermal yellowing.

The preferred method for applying the coating according to the invention is by plasma enhanced chemical vapor deposition (PECVD) of suitable monomers, which derive from the vaporization of suitable precursors, and then interact to form polymers with other monomers in a vacuum deposition chamber upon plasma lighting obtained through radio-frequency or microwave generators in the order of a few kW power, whereas the voltage applied across the deposition area is in the order of a few hundred volts. The preferred precursors are siloxanes and/or silanes (e.g., hexamethyldisiloxane (HMDSO) and tetramethylsilane (TMS)). The process of PECVD is well known, for instance from US2002/0100420, and does not need to be describer here in details.

The coating composition can be defined generally as $SiO_x$, where preferably x is comprised between 1.8 and 2. Other elements can be present in the coating, as carbon and hydrogen, but their concentration by weight should typically be less than 1%.

The thickness of the $SiO_x$ coating is preferably between 3 and 8 microns. In order to improve the adhesion of the $SiO_x$ coating, and to improve oxygen-barrier properties of the overall coating, a transparent "primer" layer based on SiC is preliminarily applied to the metal surface, with a preferred thickness lower than 0.2 microns. The SiC layer offers the advantage to accommodate the stress from tensile to compressive, depending on growth conditions. The SiC base layer is also applied by PECVD technique, using, e.g., tetramethylsiane (TMS) as precursor.

The applicant has also discovered that the composition according to the present invention is the best one for reducing visibility of fingerprints on metal surfaces of domestic appliances. Human sebum is composed of different greases having an index of refraction of about 1.4-1.5. SiOx index of refraction is also about 1.4-1.5. This allows for fingerprints to be less visible when deposited over SiOx. On the contrary, fingerprints deposited over a metallic surface, which has an essentially imaginary index of refraction and is basically reflective, interfere more with light rays impinging on the surface at sight.

When a stainless steel surface has to be coated, the method preferably comprises a preliminary step for the passivation of the stainless steel substrate surface in baths of citric acid solution. This improves the oxidation resistance of the coating. Moreover it is preferred to degrease the metallic substrate and to apply a surface etching to remove all superficial impurities.

The metal surface, after its coating by PECVD, is preferably treated in an atmosphere of oxygen and nitrogen, thereby carrying out a stabilizing treatment by forming silicon oxide from the free silicon remaining on the surface of the silicon oxide film.

The technical solution according to the present invention is particularly useful for domestic electric or gas-cooktop stainless steel cooktops, aluminum burner-bodies, burner-caps, burner-grates, outer panels (e.g., control-panel, door-frame, backsplash panel, warming drawer front, etc.), kitchen-hoods stainless steel outer panels (e.g., front, top, and side panel), electric-hob stainless steel surfaces and electric-coil-hobs stainless steel bowls.

Examples of Coated Components According to the Invention

Some examples showing improved mechanical and chemical properties observed when comparing PECVD coated to un-coated stainless steel AISI 304 samples measuring 150×150×1 mm (with 2B finish and brushed surface) are here reported.

Results from a pencil hardness test (ASTM D3363-00 Standard Test Method for Film Hardness by Pencil Test) conducted on coated and un-coated coupons show that coated stainless steel can take in excess of 9H pencil hardness, while un-coated stainless steel is scratched by a grade H pencil.

Scratch resistance test (ASTM G171-03 Standard Test Method for Scratch Hardness of Materials Using a Diamond Stylus) conducted on coated and un-coated coupons show that coated stainless steel can take 1 Newton force without scratching, while un-coated stainless steel is scratched by applying 0.25 Newton.

Taber abrasion test (ASTM D4060-95 Standard Test Method for Abrasion Resistance of Organic Coatings by the Taber Abraser) indicates that no wear can be observed after 2'000 cycles over the coated stainless steel coupon.

Stainability tests (ASTM D4828-94(2003)e1 Standard Test Methods for Practical Washability of Organic Coatings) conducted on coated and un-coated coupons have shown that no stains are observed both at room temperature and at 90° C., while many stains (mustard, ketch-up, salted water, lemon) attack the un-coated stainless steel Color difference tests (ASTM E805-01a Standard Practice for Identification of Instrumental Methods of Color or Color-Difference Measurement of Materials) have been conducted on coated and un-coated coupons to establish color change before and after high-temperature exposure.

Wear resistance tests, conducted by placing a 10×10 mm area sponge in contact with the coupon and passing it over the surface with increasing weight loads (150 g, 200 g, 250 g, 300 g, 350 g) has shown that coated stainless steel is more scratch resistant than un-coated stainless steel, for different grades of household sponge grades.

A coated and an un-coated aluminum burner bodies have been treated through a dishwasher cycle with commercially available dishwasher detergent. The un-coated burner was completely covered by a grey scale, while the coated burner was intact, and survived with no degradation 20 more dishwashing cycles.

A coated and an un-coated chromium-coated-steel grate used as an oven grate have been treated through a pyrolitic self-cleaning high-temperature (approx 500° C.) cycle. The un-coated burner was completely covered by dark blue, purple and yellow oxide scales, while the coated grate was intact, and survived with no degradation 10 more pyrolitic cycles.

A coated and an un-coated stainless steel heater disk used as a water cooker have been used for a prolonged amount of time, and water scale residues building on top of the hot surface could easily be removed from the coated part, and not so easily from the un-coated stainless steel surface.

Example of Deposition Method

The substrate material is thoroughly cleaned using alkaline cleaners and/or ultrasound cavitation in demineralized water baths, if compatible with the substrate chemistry. The part is then rinsed in demineralized water, and then dried. Visual inspection under neon fluorescent light is operated to ensure part cleanliness. The part is placed in the coating chamber by positioning it on a part-holder that has been designed so that the plasma flux and the HF electric field are uniformly distributed over the part. The part-holder can be part of a carrier, which enables easier loading and unloading of the chamber. The chamber walls are padded with panels, preferably made in aluminum so that these parts can be removed and easily sand-blasted (the carrier and part-holder are preferably also made of aluminum for the same reason). The chamber door is closed, and the coating process starts. An initial time of 3 to 4 minutes is dedicated to voiding the chamber: this time depends on pump capacity and chamber dimensions, as well as on void that needs to be obtained (typically <1.5 pa). A plasma cleaning stage (etching) of about 1 to 5 minutes is then activated using argon gas (Ar) in the chamber, to remove any remaining dirt particle. An optional interfacial layer of SiC is then grown in about 10 to 30 sec on the part surface, using TMS as the precursor gas. After this the SiOx coating is grown on the exposed surface, in about 30 to 90 min, using HMDSO as the precursor gas. The growth of silicone polymers (SiC and SiOx) occurs at a predefined electric filed voltage or power, which is dependant on the geometry and chamber layout of the components or parts being coated. An oxidizing post treatment using oxygen can optionally be applied for about 1 to 5 minutes. An anti-iridescence post treatment based on tetrafluoromethane (CF4) and O2 can optionally be applied for about 1 to 10 minutes. A final venting of the chamber, requiring about 30 sec, is operated.

We claim:

1. A method for providing a metal surface of a domestic appliance with a temperature-resistant coating, comprising: depositing a silicon oxide film on the metal surface by plasma enhanced chemical vapor deposition, the precursor being a hexamethyldisiloxane or hexamethyldisilane.

2. A method for providing a metal surface of a domestic appliance with a temperature-resistant coating, comprising: depositing a silicon oxide film on the metal surface by plasma enhanced chemical vapor deposition, the precursor being a siloxane wherein, before the deposition of the silicon oxide film, a silicon carbide film is applied to the metal surface by plasma enhanced chemical vapor deposition.

3. A method according to claim 2, wherein the precursor of the silicon carbide film is a silane or tetramethylsilane.

* * * * *